US012581716B2

(12) United States Patent
Noma et al.

(10) Patent No.: US 12,581,716 B2
(45) Date of Patent: Mar. 17, 2026

(54) SEMICONDUCTOR DEVICE WITH METAL FILM ON SEMICONDUCTOR SUBSTRATE AND METHOD OF MANUFACTURING THE SAME

(71) Applicant: DENSO CORPORATION, Kariya-city (JP)

(72) Inventors: Seiji Noma, Kariya-city (JP); Tomofusa Shiga, Kariya-city (JP); Kouji Senda, Kariya-city (JP); Tsuyoshi Nishiwaki, Toyota (JP); Yuta Furumura, Toyota (JP); Akitaka Soeno, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 528 days.

(21) Appl. No.: 18/065,916

(22) Filed: Dec. 14, 2022

(65) Prior Publication Data

US 2023/0125063 A1     Apr. 20, 2023

Related U.S. Application Data

(63) Continuation of application No. PCT/JP2021/023793, filed on Jun. 23, 2021.

(30) Foreign Application Priority Data

Jun. 26, 2020     (JP) ................................. 2020-110888

(51) Int. Cl.
*H10D 64/64*          (2025.01)
*H10D 8/60*           (2025.01)
(Continued)

(52) U.S. Cl.
CPC ............... *H10D 64/64* (2025.01); *H10D 8/60* (2025.01); *H10D 12/481* (2025.01); *H10D 64/01* (2025.01); *H10D 84/617* (2025.01)

(58) Field of Classification Search
CPC ...... H10D 64/64; H10D 12/481; H10D 64/01; H10D 84/617; H10D 8/00; H10D 30/021;
(Continued)

(56) References Cited

U.S. PATENT DOCUMENTS

2014/0191421 A1     7/2014  Sawada et al.
2015/0001667 A1     1/2015  Matsuzaki
(Continued)

FOREIGN PATENT DOCUMENTS

JP          S60-170978 A     9/1985
JP          563-012952 A     1/1988
(Continued)

*Primary Examiner* — Shahed Ahmed
(74) *Attorney, Agent, or Firm* — Posz Law Group, PLC

(57)          ABSTRACT

A semiconductor device includes a semiconductor substrate and a metal film. The metal film is located on the semiconductor substrate. The metal film includes a portion to have a Schottky junction with the semiconductor substrate. The metal film is made of an aluminum alloy in which an element is added to aluminum. The metal film includes a lower metal layer and an upper metal layer. The lower metal layer is located on the semiconductor substrate. The upper metal layer stacks on the lower metal layer. The lower metal layer has a thickness of 2.6 micrometers or less in a stacking direction of the lower metal layer and the upper metal layer.

6 Claims, 4 Drawing Sheets

(51) Int. Cl.
    *H10D 12/00*        (2025.01)
    *H10D 64/01*        (2025.01)
    *H10D 84/60*        (2025.01)

(58) Field of Classification Search
    CPC .... H10D 30/60; H10D 62/393; H10D 64/117;
           H10D 64/232; H10D 84/811; H10D
           30/87–877; H10D 30/061–0618; H10D
           8/60–605; H01L 21/28; H01L 21/244–246
    See application file for complete search history.

(56)            References Cited

U.S. PATENT DOCUMENTS

| | | |
|---|---|---|
| 2015/0325709 A1 | 11/2015 | Ito et al. |
| 2016/0141214 A1* | 5/2016 | Sato .................. H01L 23/49811 |
| | | 257/77 |
| 2017/0207331 A1* | 7/2017 | Nakanishi ............ H10D 84/403 |
| 2017/0222009 A1 | 8/2017 | Hikasa et al. |
| 2018/0174938 A1 | 6/2018 | Uchida |
| 2018/0315826 A1 | 11/2018 | Hikasa et al. |

FOREIGN PATENT DOCUMENTS

| JP | H03-076030 B2 | 12/1991 |
|---|---|---|
| JP | H08-124877 A | 5/1996 |
| JP | 2006-351717 A | 12/2006 |
| JP | 2010-278164 A | 12/2010 |
| JP | 2018-125443 A | 8/2018 |
| JP | 2019-145667 A | 8/2019 |

* cited by examiner

SEMICONDUCTOR DEVICE WITH METAL FILM ON SEMICONDUCTOR SUBSTRATE AND METHOD OF MANUFACTURING THE SAME

CROSS REFERENCE TO RELATED APPLICATIONS

The present application is a continuation application of International Patent Application No. PCT/JP2021/023793 filed on Jun. 23, 2021, which designated the U.S. and claims the benefit of priority from Japanese Patent Application No. 2020-110888 filed on Jun. 26, 2020. The entire disclosures of all of the above applications are incorporated herein by reference.

TECHNICAL FIELD

The present disclosure relates to a semiconductor device and a method of manufacturing the semiconductor device.

BACKGROUND

A semiconductor device may have a metal film on a semiconductor substrate such as silicon, and the metal film may form a Schottky junction with the semiconductor substrate. The metal film may be made of an aluminum alloy in which an element such as silicon or copper is added to aluminum.

SUMMARY

The present disclosure describes a semiconductor device having a semiconductor substrate and a metal film, and further describes a method of manufacturing the semiconductor device including formation of the semiconductor substrate and formation of the metal film.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
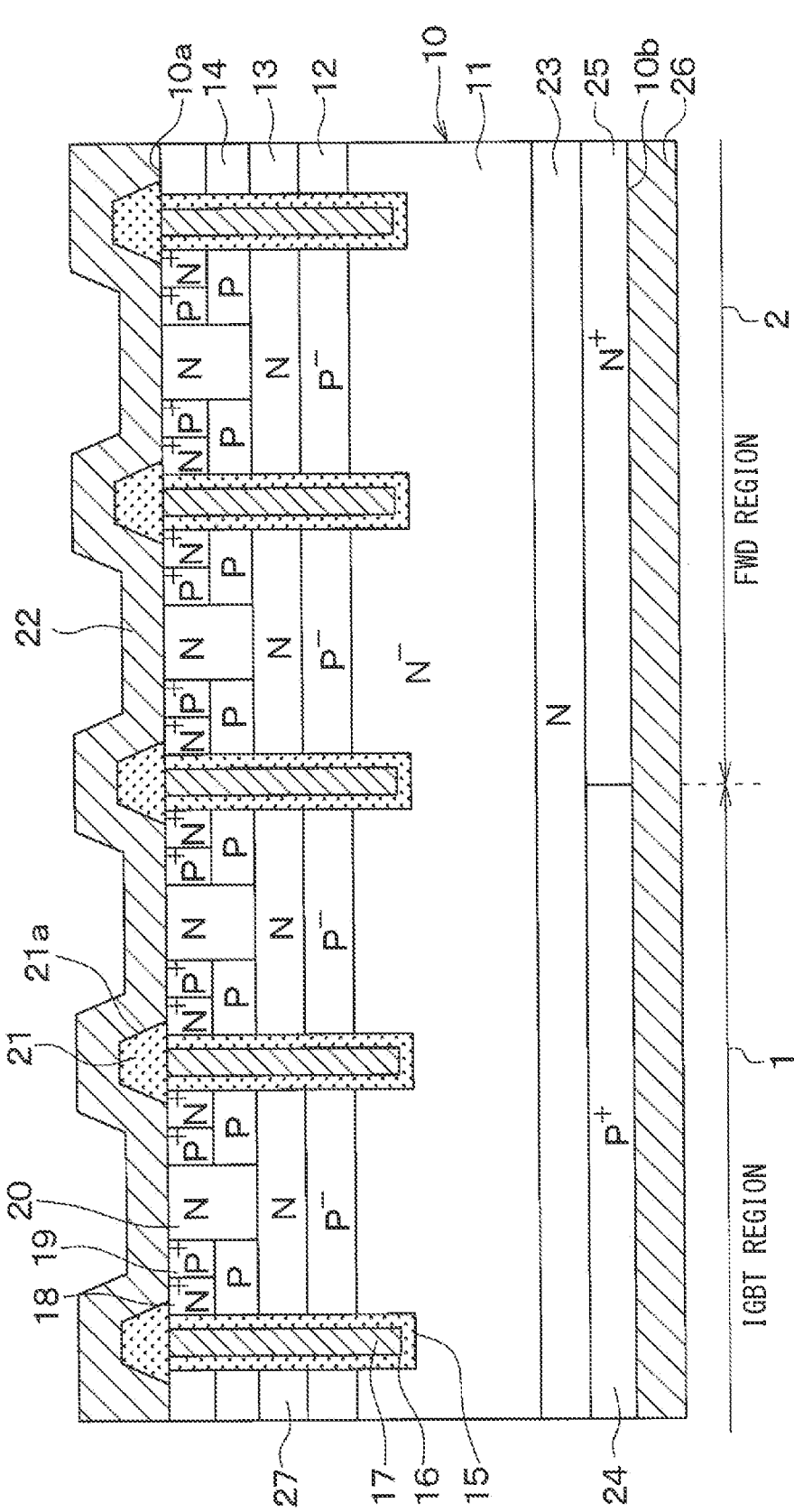
FIG. 1 is a cross-sectional view of a semiconductor device according to a first embodiment.

In a semiconductor device having a metal film to form a Schottky junction with a semiconductor substrate such as silicon, if a nodule is formed inside the metal film, stress caused by the nodule may be applied to the portion of the metal film to have the Schottky junction. In a case where the stress is large, it is possible that a Schottky barrier changes, and it is possible that a leakage fault rate increases. For this reason, a semiconductor device having a prescribed portion to have the Schottky junction may be provided. In particular, in the semiconductor device described above, an interlayer insulation film is formed on the semiconductor substrate; and a contact hole for exposing the semiconductor substrate is formed at the interlayer insulation film. The semiconductor device is formed such that the metal film has a portion to have the Schottky junction with the semiconductor substrate through the contact hole. In this semiconductor device, since the nodule formed at the metal film is easily formed in the vicinity of an opening of the interlayer insulation film, the portion of the metal film to have the Schottky junction is located apart from the vicinity of the opening of the interlayer insulation film. The semiconductor device has a portion of the semiconductor substrate exposed from the interlayer insulation film. In this portion, the metal film has an ohmic junction with the semiconductor substrate in the vicinity of the opening. In the inner edge of the semiconductor substrate, the metal film has the Schottky junction with the semiconductor substrate.

In the semiconductor device described above, the Schottky junction is formed at a portion different from the portion where the nodule is easily formed. However, the nodule may also be formed at a position away from the vicinity of the opening. For example, in a case where the semiconductor substrate is enlarged in a planar direction, the influence of the nodule may not be neglected. Additionally, the leakage fault rate may also increase.

According to a first aspect of the present disclosure, a semiconductor substrate and a metal film. The metal film is located on the semiconductor substrate. The metal film includes a portion to have a Schottky junction with the semiconductor substrate. The metal film is made of an aluminum alloy in which an element is added to aluminum. The metal film includes a lower metal layer and an upper metal layer. The lower metal layer is located on the semiconductor substrate. The upper metal layer stacks on the lower metal layer. The lower metal layer has a thickness of 2.6 micrometers or less in a stacking direction of the lower metal layer and the upper metal layer.

Since the thickness of the lower metal layer is 2.6 micrometers or less, it is possible to suppress an increase in the leakage fault rate.

According to a second aspect of the present disclosure, a method of manufacturing a semiconductor device includes preparation of a semiconductor substrate and formation of a metal film on the semiconductor substrate. The metal film includes a lower metal layer and an upper metal layer. The metal film has a portion to have a Schottky junction with the semiconductor substrate, and the metal film is made of an aluminum alloy in which an element is added to aluminum. The formation of the metal film includes formation of the lower metal layer at the semiconductor substrate and formation of the upper metal layer on the lower metal layer. In the formation of the lower metal layer, the lower metal layer is formed to have a thickness of 2.6 micrometers or less in a stacking direction of the lower metal layer and the upper metal layer.

Since the lower metal layer is formed to have the thickness of 2.6 micrometers or less, it is possible to manufacture the semiconductor device that suppresses an increase in the leakage fault rate.

The following describes multiple embodiments with reference to the drawings. Hereinafter, in the respective embodiments, substantially the same configurations are denoted by identical symbols, and repetitive description will be omitted.

(First Embodiment) A first embodiment will be described with reference to the drawings. As illustrated in FIG. 1, the semiconductor device includes a semiconductor substrate 10 which is shared by an insulated gate bipolar transistor (IGBT) region 1 and a freewheeling diode (FWD) region 2. The IGBT region 1 has an IGBT element, and the FWD region 2 has an FWD element. That is, the semiconductor device according to the present embodiment is a reverse conducting (RC) IGBT. In the semiconductor device according to the present embodiment, the portion above a collector layer 24 located at a second surface 10b of the semiconductor substrate 10 is set as the IGBT region 1, and the portion above a cathode layer 25 located at the second surface 10b of the semiconductor substrate 10 is set as the FWD region 2.

The semiconductor device has the semiconductor substrate 10 included in an N$^-$-type drift layer 11. The N$^-$-type drift layer 11 may also be simply referred to as a drift layer 11 in the following. In the present embodiment, the semiconductor substrate 10 is made of a silicon substrate. On the drift layer 11, a P$^-$-type electrical field relaxation region 12 and an N-type barrier region 13 are formed in order from the drift layer 11. The P$^-$-type electrical field relaxation region 12 has lower impurity concentration than the drift layer 11. The N-type barrier region 13 has higher impurity concentration than the drift layer 11. The P$^-$-type electrical field relaxation region 12 may be simply referred to as an electrical field relaxation region 12 in the following, and the N-type barrier region 13 may be simply referred to as a barrier region 13 in the following. On the barrier region 13, a P-type base layer 14 is formed. The P-type base layer 14 has higher impurity concentration than the electrical field relaxation region 12. The P-type base layer 14 may be simply referred to as a base layer 14 in the following. The description "on the drift layer 11" refers to a first surface 10a side of the semiconductor substrate 10.

Multiple trenches 15 are formed at the semiconductor substrate 10 so as to penetrate through the base layer 14, the barrier region 13, and the electrical field relaxation region 12 from the first surface 10a side to reach the drift layer 11. Accordingly, the base layer 14, the barrier region 13 and the electrical field relaxation region 12 are divided into several pieces by the trenches 15. In the present embodiment, the trenches 15 are respectively formed in the IGBT region 1 and the FWD region 2. In the present embodiment, the trenches 15 are formed in a striped shape with the direction intersecting the arrangement direction of the IGBT region 1 and the FWD region 2 (that is, the depth direction on the paper surface in FIG. 1) as the longitudinal direction.

Each of the trenches 15 is filled with a gate insulation film 16 and a gate electrode 17. The gate insulation film 16 is formed so as to cover a wall surface of each of the trenches 15, and the gate electrode 17 is made of polysilicon or the like and formed on the gate insulation film 16. Accordingly, the trench gate structure is formed.

Although not shown, the gate electrode 17 formed in the IGBT region 1 is connected to, for example, a gate driver (not shown) through, for example, a gate pad for receiving an application of a predetermined voltage. The gate electrode 17 formed in the FWD region 2 is maintained at a predetermined potential. For example, the gate electrode 17 formed in the FWD region 2 is connected to an upper electrode 22, and is maintained at the same potential as the upper electrode 22.

An emitter region 18, a contact region 19, and a pillar region 20 are formed at the base layer 14. The emitter region 18 is the N$^+$-type and has higher impurity concentration than the drift layer 11, and is formed at a surface layer portion of the base layer 14. The emitter region 18 is formed so as to terminate in the base layer 14 and to be in contact with a side surface of each of the trenches 15. The emitter region 18 extends in a bar shape along the longitudinal direction of each of the trenches 15 in a region between adjacent two of the trenches 15, and is terminated inside a distal end of each of the trenches 15.

The contact region 19 is a P$^+$-type and has higher impurity concentration than the base layer 14, and is formed at the surface layer portion of the base layer 14. The contact region 19 is formed to be terminated inside the base layer 14 and sandwiched between two emitter regions 18. The contact region 19 extends in a bar shape along the longitudinal direction of each of the trenches 15 to be in contact with the emitter region 18.

The impurity concentration of the pillar region 20 is at a comparable level with respect to the barrier region 13. The pillar region 20 is formed to penetrate the contact region 19 and the base layer 14 to reach the barrier region 13. The pillar region 20 is formed so as to be connected to the barrier region 13.

On the first surface 10a of the semiconductor substrate 10, an interlayer insulation film 21 made of, for example, borophosphosilicate glass (BPSG) is formed. A contact hole 21a is formed at the interlayer insulation film 21. The contact hole 21a exposes the emitter region 18, the contact region 19 and the pillar region 20.

The upper electrode 22 is formed on the interlayer insulation film 21. The upper electrode 22 corresponds to a metal film. In the IGBT region 1 and the FWD region 2, the upper electrode 22 has an ohmic junction with the emitter region 18 and the contact region 19 through the contact hole 21a formed at the interlayer insulation film 21; and the upper electrode 22 has a Schottky junction with the pillar region 20. In other words, the upper electrode 22 according to the present embodiment has a structure having both of a Schottky junction portion and an ohmic-contact portion. With the formation of the upper electrode 22, the upper electrode 22 functions as an emitter electrode in the IGBT region 1 and functions as an anode electrode in the FWD region 2. A specific structure of the upper electrode 22 will be described hereinafter.

An N-type field stop layer 23 having carrier concentration higher than the drift layer 11 is formed on a side of the drift layer 11 opposite to the base layer 14. In the following, the N-type field stop layer 23 may also be simply referred to as an FS layer 23. The FS layer 23 is formed at a side closer to the second surface 10b of the semiconductor substrate 10.

In the IGBT region 1, a P$^+$-type collector layer 24 is formed on the side opposite to the drift layer 11 across the FS layer 23. In the FWD region 2, an N$^+$-type cathode layer 25 is formed on the side opposite to the drift layer 11 across the FS layer 23. In the following, the P$^+$-type collector layer 24 may also be simply referred to as the collector layer 24, and the N$^+$-type cathode layer 25 may also be simply referred to as the cathode layer 25. In the present embodiment, the IGBT region 1 and the FWD region 2 are distinguished from each other depending on whether a layer formed on the second surface 10b of the semiconductor substrate 10 is the collector layer 24 or the cathode layer 25.

In other words, in the semiconductor device according to the present embodiment, the portion on the collector layer 24 is the IGBT region 1, and the portion on the cathode layer 25 is the FWD region 2.

At the side opposite to the drift layer 11 across the collector layer 24 and the cathode layer 25, a lower electrode 26 is formed to be electrically connected to the collector layer 24 and the cathode layer 25. In other words, the lower electrode 26 is formed at the second surface 10b of the semiconductor substrate 10. The lower electrode 26 functions as a collector electrode in the IGBT region 1, and functions as a cathode electrode in the FWD region 2.

The semiconductor device according to the present embodiment includes the IGBT element in the IGBT region 1. The IGBT element includes the base layer 14 as a base of the IGBT element, the emitter region 18 as an emitter of the IGBT element, and the collector layer 24 as a collector of the IGBT element. The semiconductor device according to the present embodiment also includes the FWD element in the FWD region 2. The FWD element with a PN junction includes a base layer as the anode, and further includes the drift layer 11, the FS layer 23 and the cathode layer 25 as the cathode.

The structure of the semiconductor device according to the present embodiment is described above. In the present embodiment, the N-type, the N⁺-type, and the N⁻-type correspond to a first conductive type, and the P-type, the P⁻-type, and P⁺-type correspond to a second conductive type. Further, in the present embodiment, the semiconductor substrate 10 has a structure including the collector layer 24, the cathode layer 25, the FS layer 23, the drift layer 11, the electrical field relaxation region 12, the barrier region 13, the base layer 14, the emitter region 18, the contact region 19, and the pillar region 20.

The following describes the upper electrode 22 in the present embodiment. The upper electrode 22 of the present embodiment is made of an aluminum alloy in which an element is added to aluminum, such as an aluminum-silicon (AlSi) alloy, an aluminum-copper (AlCu) alloy, an aluminum-silicon-copper (AlSiCu) alloy. In the present embodiment, the upper electrode 22 is formed by sputtering as will be described hereinafter. However, in order to inhibit the generation of an alloy spike, an added element is added to have limit solid solubility higher than or equal to limit solid solubility of the aluminum for the temperature at the time of sputtering. The upper electrode 22 according to the present embodiment is formed to have a thickness of 3 micrometers (μm) or more so as not to have a breakdown easily, when a probe needle or the like for inspecting the characteristics of the semiconductor device is in contact with the upper electrode 22.

Figure 2:
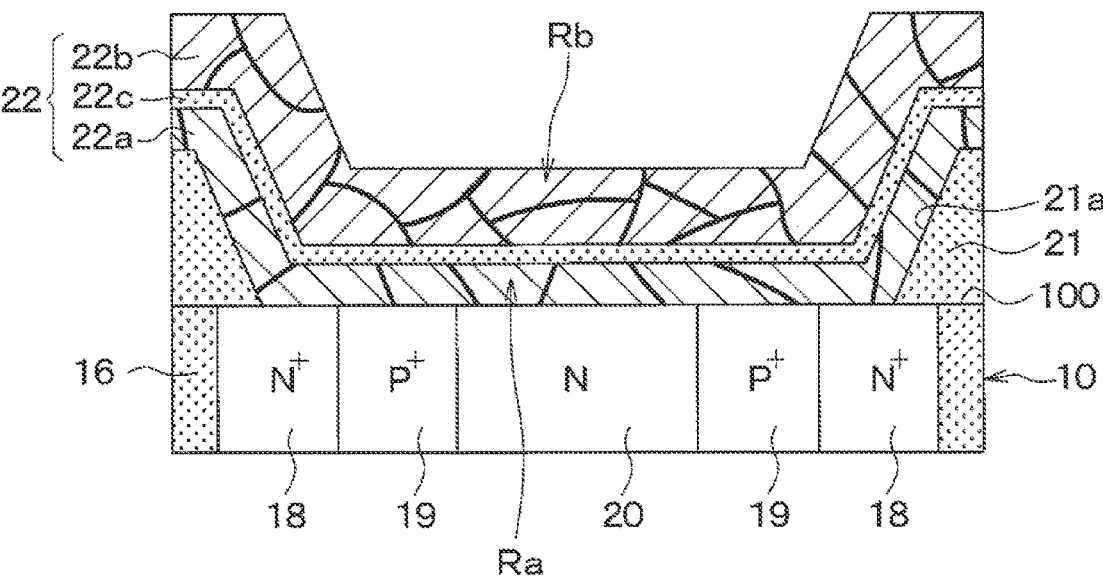
FIG. 2 is an enlarged view of vicinity of an interface between a semiconductor substrate and an upper electrode in FIG. 1.

As illustrated in FIG. 2, the upper electrode 22 is formed by stacking a lower metal layer 22a and an upper metal layer 22b from the semiconductor substrate 10. In the upper electrode 22, the lower metal layer 22a has an ohmic junction or a Schottky junction with the semiconductor substrate 10. Specifically, in the upper electrode 22, the lower metal layer 22a has the ohmic junction with the emitter region 18 and the contact region 19, and has Schottky junction with the pillar region 20.

The upper electrode 22 in the present embodiment includes an insulation film 22c arranged between the lower metal layer 22a and the upper metal layer 22b. The insulation film 22c is a natural oxide film formed by forming the lower metal layer 22a through sputtering and exposing the lower metal layer 22a to the atmosphere, and a thickness of the insulation film 22c is set to be extremely thin, at 10 nanometers or less. For this reason, the lower metal layer 22a and the upper metal layer 22b are electrically connected through a tunnel effect. For understanding the insulation film 22c, FIG. 2 illustrates an enlarged insulation film 22c.

The upper electrode 22 is in a state in which particles Ra included in the lower metal layer 22a and particles Rb included in the upper metal layer 22b are separated. In other words, the grain boundary of the particle Ra included in the lower metal layer 22a and the grain boundary of the particle Rb included in the upper metal layer 22b are not connected but are separated. The grain boundary of the particle Ra included in the lower metal layer 22a and the grain boundary of the particle Rb included in the upper metal layer 22b respectively are terminated in the respective layers. Therefore, even though the nodule is generated in the lower metal layer 22a, the nodule is terminated inside the lower metal layer 22a, and does not protrude to the upper metal layer 22b.

The nodule precipitates inside the aluminum alloy included in the upper electrode 22 as described above. If the nodule is formed in a portion where the Schottky junction is formed, the Schottky barrier may fluctuate due to the stress caused by the nodule, and a leakage fault may occur. In this case, the nodule easily grow in the thickness direction of the upper electrode 22. In other words, the stress caused by the nodule easily depends on the length of the nodule in the thickness direction of the upper electrode 22.

In the upper electrode 22 according to the present embodiment, the nodule inside the lower metal layer 22a does not protrude into the upper metal layer 22b as described above. For this reason, the stress caused by the nodule depends on the thickness of the lower metal layer 22a. The thickness described above is the length along the stacking direction of the lower metal layer 22a and the upper metal layer 22b.

Figure 3:
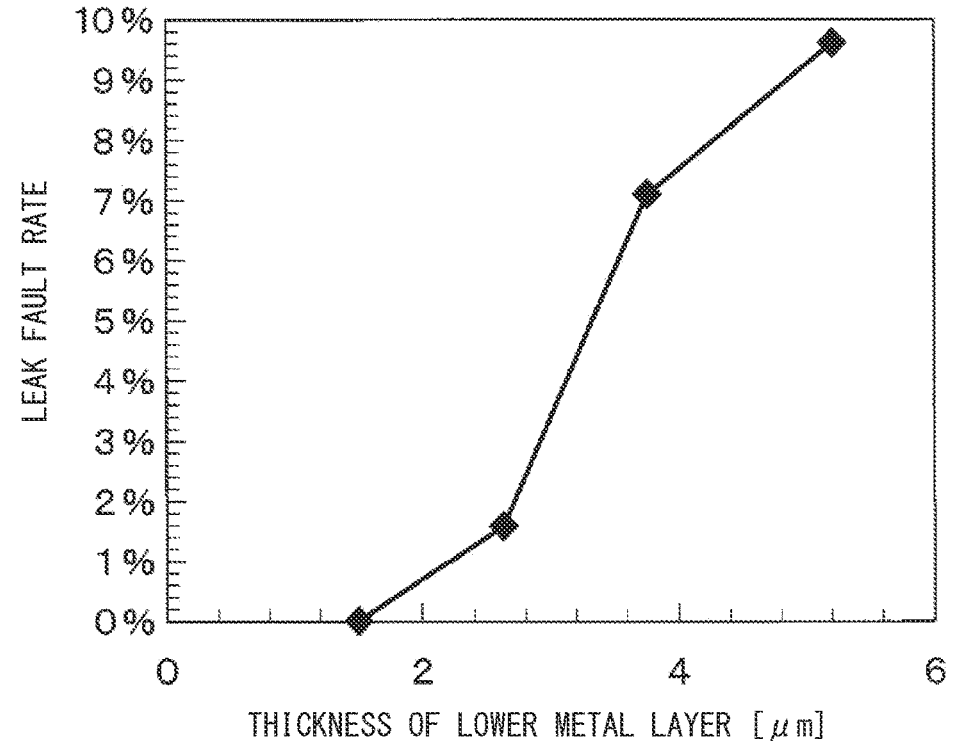
FIG. 3 illustrates a relationship between a thickness of a lower metal layer and a leakage fault rate.

The inventors in the present application obtained the result shown in FIG. 3 by reviewing the relationship between the thickness of the lower metal layer 22a and the leakage fault rate. As illustrated in FIG. 3, it is confirmed that the leakage fault rate begins to occur when the lower metal layer 22a is 1.5 μm or more; and the leakage fault rate increases steeply when the lower metal layer 22a is 2.6 μm or more. Therefore, in the present embodiment, the lower metal layer 22a has a thickness of 2.6 μm or less. The leakage fault rate can be sufficiently reduced by making the thickness of the lower metal layer 22a to be 1.5 μm or less.

The structure of the semiconductor device according to the present embodiment has been described above. The following describes a basic operation of the above-mentioned semiconductor device.

First, in the semiconductor device, when a voltage higher than that of the upper electrode 22 is applied to the lower electrode 26, the PN junction formed between the base layer 14 and the drift layer 11 is brought into a reverse conduction state to form a depletion layer. When a low-level voltage (for example, 0 V) that is less than a threshold voltage Vth of the insulated gate structure is applied to the gate electrode 17, a current does not flow between the upper electrode 22 and the lower electrode 26.

In order to turn the IGBT element to the ON state, a high-level voltage, which is equal to or higher than the threshold voltage Vth of the insulated gate structure, is applied to the gate electrode 17 of the IGBT region 1 in a state where a voltage higher than that of the upper electrode 22 is applied to the lower electrode 26. As a result, in the IGBT region 1, an inversion layer is formed in a portion of the base layer 14 which is in contact with each trench 15 in which the gate electrode 17 is disposed. Each IGBT element is turned to the ON-state by supplying electrons from the emitter region 18 to the drift layer 11 through the inversion layer, thereby supplying holes from the collector layer 24 to the drift layer 11, and decreasing the resistance value of the drift layer 11 by the conductivity modulation.

When the IGBT element is turned to OFF-state and the FWD element is turned to the ON-state (that is, the FWD element is operated as a diode), the voltage to be applied to the upper electrode 22 and the lower electrode 26 is switched, and a voltage higher than that applied to the lower electrode 26 is applied to the upper electrode 22. Therefore, in the FWD region 2, the Schottky junction between the upper electrode 22 and the pillar region 20 is turned on. Subsequently, electrons flow toward the upper electrode 22 from the lower electrode 26 through the cathode layer 25, the drift layer 11, the electrical field relaxation region 12, the barrier region 13 and the pillar region 20, and the potential of the barrier region 13 is changed to a potential closer to the potential of the upper electrode 22.

In the FWD region 2, a potential difference is hardly generated at the PN junction formed at the boundary between the base layer 14 and the barrier region 13. Therefore, even if the potential of the upper electrode 22 is increased thereafter, the PN junction is not turned on for a while. When the potential of the upper electrode 22 is further increased, the current flowing through the Schottky junction also increases. Therefore, the potential difference between the upper electrode 22 and the barrier region 13 increases, and the potential difference generated at the PN junction also increases. When the potential of the upper electrode 22 is raised above a predetermined potential, the PN junction, that is, the FWD element is turned on. The electrons flow toward the upper electrode 22 from the lower electrode 26 through the barrier region 13 and the base layer 14.

In the semiconductor device according to the present embodiment, the timing of turning on the PN junction is delayed by firstly turning on the Schottky junction when the potential of the upper electrode 22 rises. Therefore, the flow of holes into the drift layer 11 is suppressed. Thus, it is possible to reduce a recovery current and recovery loss when the FWD element is in a recovery operation.

In the semiconductor device according to the present embodiment, also in the IGBT region, a parasitic diode is formed by the PN junction between the base layer 14 and the barrier region 13. The barrier region 13 of the IGBT element at the PN junction is connected to the upper electrode 22 through the pillar region 20. Therefore, as described above, when the potential of the upper electrode 22 rises, the current firstly flows to the pillar region 20. Subsequently, when a forward voltage further rises, the PN junction included in the parasitic diode is turned on. Also in the IGBT region 1, the timing of turning on the PN junction is delayed, and the flow of the holes to the drift layer 11 is suppressed. Thus, the recovery current is suppressed.

Further, in the semiconductor device of the present embodiment, the electrical field relaxation region 12 is formed between the barrier region 13 and the drift layer 11. Therefore, as compared with the case where the electrical field relaxation region 12 is not formed, it is difficult for the equipotential lines to enter between the trenches 15 due to the PN junction formed between the electrical field relaxation region 12 and the drift layer 11. Thus, the breakdown voltage can be further enhanced.

The following describes a method of manufacturing the upper electrode 22 in the semiconductor device.

Although not shown, the semiconductor substrate 10 for forming, for example, the base layer 14, the emitter region 18, the contact region 19 and the pillar region 20 is prepared for a semiconductor manufacturing process. Subsequently, the interlayer insulation film 21 is formed on the first surface 10a of the semiconductor substrate 10, and the contact hole 21a is formed at the interlayer insulation film 21.

Figure 4A:
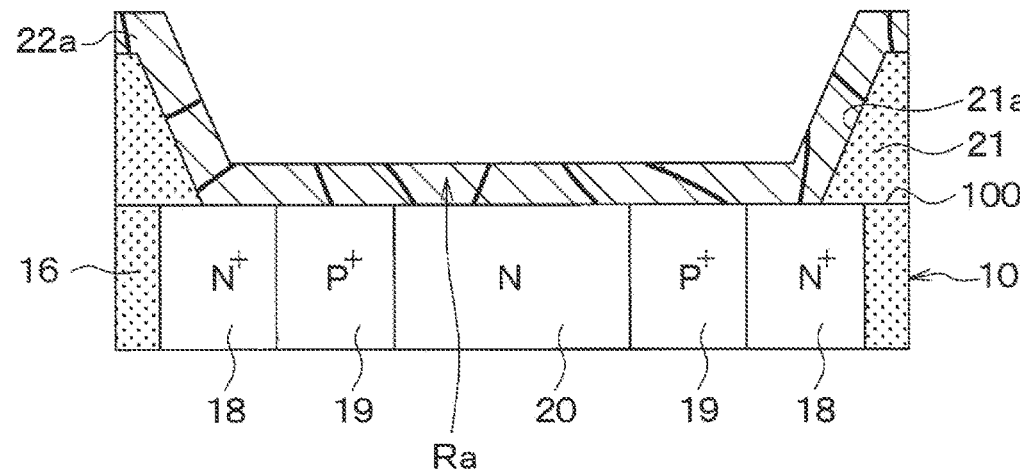
FIG. 4A is a cross-sectional view showing a manufacturing process of the upper electrode in the first embodiment.

As illustrated in FIG. 4A, the semiconductor substrate 10 is arranged in a sputtering apparatus, and the lower metal layer 22a is formed by sputtering. At this time, the lower metal layer 22a is formed by adding an element having the limit solid solubility higher than or equal to the limit solid solubility of the aluminum for the temperature at the time of sputtering so that alloy spikes are less likely to occur. Therefore, it is not necessary to form, for example, a barrier metal at a portion where the upper electrode 22 has an ohmic junction with the semiconductor substrate 10 because alloy spikes are less likely to occur. In other words, in the present embodiment, the upper electrode 22 having a portion to have an ohmic junction with the semiconductor substrate 10 and a portion to have a Schottky junction with the semiconductor substrate 10 can be formed by the identical process without forming, for example, the barrier metal. Further, in this embodiment, the lower metal layer 22a is formed to have a thickness of 2.6 μm or less as described above.

Figure 4B:
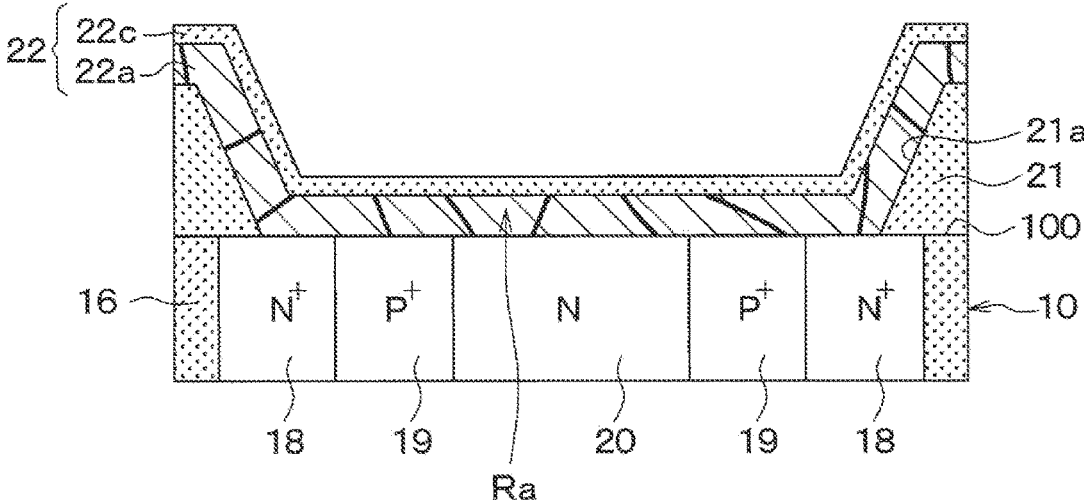
FIG. 4B is a cross-sectional view showing a manufacturing process of the upper electrode following FIG. 4A.
Figure 4C:
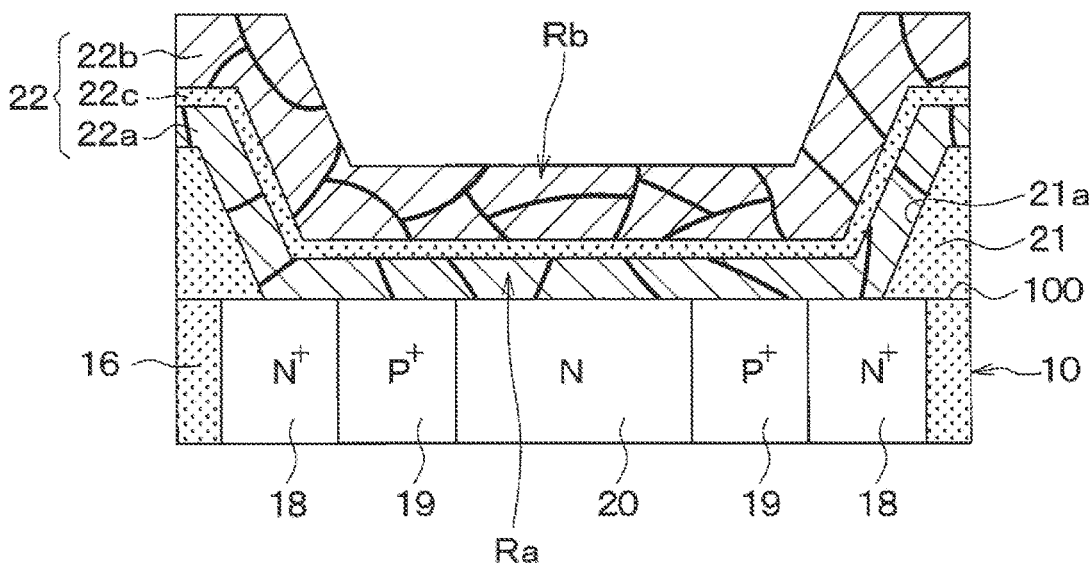
FIG. 4C is a cross-sectional view showing a manufacturing process of the upper electrode following FIG. 4B.

As illustrated in FIG. 4B, the semiconductor substrate 10 is removed from the sputtering apparatus and exposed to the atmosphere to form the insulation film 22c on the lower metal layer 22a. As illustrated in FIG. 4C, the semiconductor substrate 10 is again arranged in the sputtering apparatus, and the upper metal layer 22b is formed by conducting the sputtering as similar to the lower metal layer 22a. Therefore, the upper electrode 22 according to the present embodiment is formed.

At this time, since the insulation film 22c is formed at the surface of the lower metal layer 22a, the grain boundary of the particle Ra included in the lower metal layer 22a does not protrude into the upper metal layer 22a. In other words, it is possible to suppress the enlargement of the nodule generated in the lower metal layer 22a in the thickness direction of the upper electrode 22. Therefore, it is possible to manufacture the semiconductor device in which the leakage fault is less likely to occur.

According to the present embodiment, the upper electrode 22 is formed by stacking the upper metal layer 22b on the lower metal layer 22a. The grain boundary in the lower metal layer 22a and the grain boundary in the upper metal layer 22b are not connected and are separated. The lower metal layer 22a has a thickness of 2.6 μm or less. Even though the nodule is formed in the portion of the lower metal layer 22a having the Schottky junction, it is possible to suppress an increase in the leakage fault rate. In this situation, the leakage fault rate can be further suppressed by making the thickness of the lower metal layer 22a to be 1.5 μm or less. In the present embodiment, an increase in the leakage fault rate is suppressed by preventing the nodule from becoming excessively large. Even though the semiconductor substrate 10 is enlarged in the planar direction, it is possible to suppress an increase in the leakage fault rate. In addition, it is possible to enhance the degree of freedom in designing the semiconductor device.

In the present embodiment, at the time of forming the lower metal layer 22a, an element having the limit solid solubility equal to or higher than the limit solid solubility of the aluminum at the temperature of sputtering is added. Therefore, it is possible to suppress the generation of alloy spikes. Even though the barrier metal is not formed, the lower metal layer 22a can have an ohmic junction with the semiconductor substrate 10. In other words, the lower metal layer 22a having a portion to have an ohmic junction and a portion to have a Schottky junction can be formed by the identical process without forming the barrier metal. When the element having limit solid solubility higher than or equal to the limit solid solubility of the aluminum at the tempera- ture of sputtering is added to form the lower metal layer 22a, the nodule is easily generated. However, an increase in the leakage fault rate is suppressed by making the lower metal layer 22a to have a thickness of 2.6 μm or less.

(Second Embodiment) The following describes a second embodiment. The present embodiment is different from the first embodiment, such that the average particle size of the particles Rb included in the upper metal layer 22b is smaller than the average particle size of the particles Ra included in the lower metal layer 22a in the present embodiment. The other configurations are the same as those of the first embodiment, and therefore a description of the same con- figurations will be omitted below. The average particle size described in the present disclosure may also be referred to, for example, an average particle diameter or an average particle radius.

Figure 5:
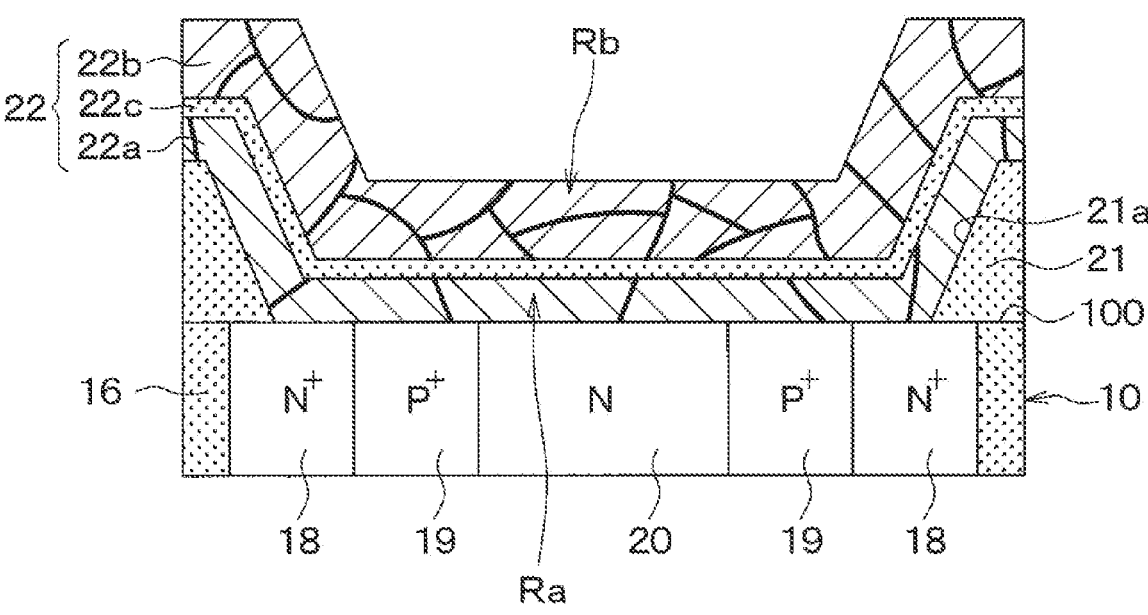
FIG. 5 is an enlarged view of vicinity of an interface between a semiconductor substrate and an upper electrode in a second embodiment.

In the present embodiment, as illustrated in FIG. 5, in the upper electrode 22, the average particle size of the particles Rb included in the upper metal layer 22b is smaller than the average particle size of the particles Ra included in the lower metal layer 22a.

The upper electrode 22 is manufactured as follows.

When the lower metal layer 22a is formed in the process illustrated in FIG. 4A, the sputtering at a temperature of 400 degrees Celsius or higher is conducted. Subsequently, when the upper metal layer 22b is formed in the process illustrated in FIG. 4C, the sputtering at a lower temperature than the sputtering for forming the lower metal layer 22a is con- ducted. For example, the sputtering at about 300 to 350 degrees Celsius is conducted when the upper metal layer 22b is formed. When the metal layer is formed with the sput- tering, since the average particle size becomes larger as the temperature rises, the average particle size of the particles Rb included in the upper metal layer 22b is smaller than the average particle size of the particles Ra included in the lower metal layer 22a.

According to the present embodiment, the average par- ticle size of the particles Rb included in the upper metal layer 22b is smaller than the average particle size of the particles Ra included in the lower metal layer 22a in the present embodiment. Therefore, as compared with the case in which the average particle size of the particles Rb included in the upper metal layer 22b is larger than or equal to the average particle size of the particles Ra included in the lower metal layer 22a, the boundary step of the grain boundary becomes smaller at the surface of the upper metal layer 22b on a side opposite from the lower metal layer 22a. Therefore, it is possible to reduce the possibility of errone- ously determining a grain boundary step as a fault or foreign matter when performing an appearance inspection.

(Third Embodiment) The following describes a third embodiment. The present embodiment is different from the first embodiment, such that the insulation film 22c is not arranged between the upper metal layer 22b and the lower metal layer 22a. The other configurations are the same as those of the first embodiment, and therefore a description of the same configurations will be omitted below.

Figure 6:
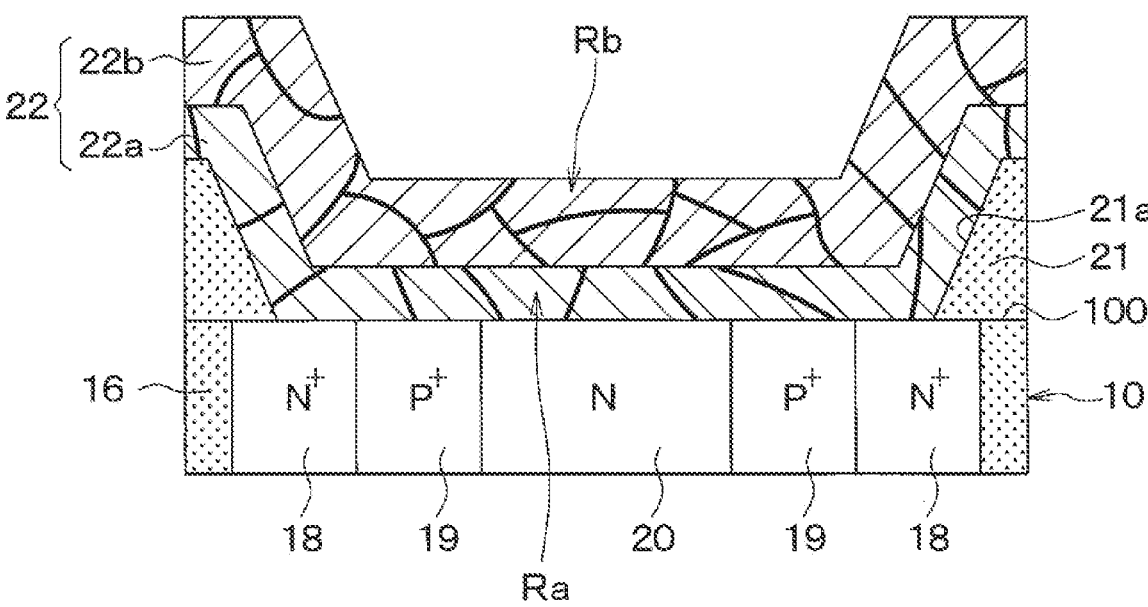
FIG. 6 is an enlarged view of vicinity of an interface between a semiconductor substrate and an upper electrode in a third embodiment.

As illustrated in FIG. 6, in the present embodiment, in the upper electrode 22, the insulation film 22c is not arranged between the lower metal layer 22a and the upper metal layer 22b.

The upper electrode 22 is manufactured as follows.

After the sputtering for forming the lower metal layer 22a is conducted in the process illustrated in FIG. 4A, inert gas such as argon is introduced into the sputtering apparatus to cool down the lower metal layer 22a to completely stop the growth of the particles Ra included in the lower metal layer 22a. Subsequently, the process illustrated in FIG. 4C is conducted without conducting the process illustrated in FIG. 4B. At this time, since the growth of the particles Ra included in the lower metal layer 22a is completely stopped, the upper metal layer 22b is formed by the particles Rb different from the particles Ra included in the lower metal layer 22a. Therefore, the particles Ra included in the lower metal layer 22a and particles Rb included in the upper metal layer 22b are separated.

Even though the insulation film 22c is not arranged between the lower metal layer 22a and the upper metal layer 22b, it is possible to attain the effects identical to the effects in the first embodiment, as long as the particles Ra included in the lower metal layer 22a and the particles Rb included in the upper metal layer 22b are separated.

(Other Embodiments) Although the present disclosure has been described in accordance with the embodiments, it is understood that the present disclosure is not limited to such embodiments or structures. The present disclosure encom- passes various modifications and variations within the scope of equivalents. In addition, while the various elements are shown in various combinations and configurations, which are exemplary, other combinations and configurations, including more, less or only a single element, are also within the spirit and scope of the present disclosure.

Each of the above embodiments describes that the semi- conductor device includes the IGBT region 1 and the FWD region 2. However, if the semiconductor has a portion to be a Schottky junction, the semiconductor device may have only one of the IGBT region 1 and the FWD region 2. The upper electrode 22 may have only a portion to be the Schottky junction, or may not have a portion to be an ohmic junction. In each of the above embodiments, the lower metal layer 22a and the upper metal layer 22b may have different compositions.

The embodiments described above can also be combined with each other. For example, through the combination of the second embodiment and the third embodiment, the average particle size of the particles Rb included in the upper metal layer 22b is smaller than the average particle size of the particles Ra included in the lower metal layer 22a. The combination of two or more above-described embodiments may be further combined with another embodiment.

What is claimed is:

1. A semiconductor device comprising:
a semiconductor substrate; and
a metal film located on the semiconductor substrate, the metal film including a portion having a Schottky junc- tion with the semiconductor substrate, the metal film made of an aluminum alloy in which an element is added to aluminum,
wherein the metal film includes:
a lower metal layer located on the semiconductor substrate; and
an upper metal layer stacking on the lower metal layer,
wherein the lower metal layer has a thickness of 2.6 micrometers or less in a stacking direction of the lower metal layer and the upper metal layer,
wherein the metal film has a thickness of 3 micrometers or more in the stacking direction, wherein the metal film has a plurality of particles inside the lower metal layer and a plurality of particles inside the upper metal layer, wherein the plurality of particles inside the lower metal layer are separated from the plurality of particles inside the upper metal layer, wherein an insulation film is between the upper metal layer and the lower metal layer, and has a thickness that enables an electrical connection between the lower metal layer and the upper metal layer, and wherein the thickness of the insulation film is 10 nanometers or less.

2. The semiconductor device according to claim 1, wherein the metal film has a plurality of particles inside the lower metal layer and a plurality of particles inside the upper metal layer, and wherein an average particle size of the plurality of particles inside the upper metal layer is smaller than an average particle size of the plurality of particles inside the lower metal layer.

3. The semiconductor device according to claim 1, wherein the metal film further includes another portion having an ohmic junction with the semiconductor substrate, in addition to the portion having the Schottky junction with the semiconductor substrate.

4. A method of manufacturing a semiconductor device, the method comprising:

preparing a semiconductor substrate;

forming a metal film on the semiconductor substrate, the metal film including a lower metal layer and an upper metal layer, the metal film having a portion to form a Schottky junction with the semiconductor substrate, the metal film made of an aluminum alloy in which an element is added to aluminum; and forming an insulation film between the upper metal layer and the lower metal layer, wherein the forming of the metal film includes:

forming the lower metal layer on the semiconductor substrate; and forming the upper metal layer on the lower metal layer, wherein, in the forming of the lower metal layer, the lower metal layer is formed to have a thickness of 2.6 micrometers or less in a stacking direction of the lower metal layer and the upper metal layer, wherein, in the forming of the metal film, the metal film is formed to have a thickness of 3 micrometers or more in the stacking direction, wherein in the forming of the metal film, the metal film has a plurality of particles inside the lower metal layer and a plurality of particles inside the upper metal layer, wherein in the forming of the metal film, the plurality of particles inside the lower metal layer are separated from the plurality of particles inside the upper metal layer, wherein in the forming of the insulation film, the insulation film has a thickness that enables an electrical connection between the lower metal layer and the upper metal layer, and wherein in the forming of the insulation film, the thickness of the insulation film is 10 nanometers or less.

5. The method according to claim 4, wherein the forming of the lower metal layer and the forming of the upper metal layer are conducted by sputtering, and wherein the sputtering in the forming of the upper metal layer is conducted at a lower temperature than the sputtering in the forming of the lower metal layer.

6. The method according to claim 4, wherein the forming of the lower metal layer includes forming the aluminum alloy having the element with limit solid solubility higher than or equal to the aluminum.

* * * * *